(12) United States Patent
Markulic et al.

(10) Patent No.: US 10,516,423 B2
(45) Date of Patent: Dec. 24, 2019

(54) POLAR TRANSMITTER AND METHOD FOR GENERATING A TRANSMIT SIGNAL USING A POLAR TRANSMITTER

(71) Applicants: IMEC VZW, Leuven (BE); VRIJE UNIVERSITEIT BRUSSEL, Brussels (BE)

(72) Inventors: Nereo Markulic, Leuven (BE); Jan Craninckx, Boutersem (BE)

(73) Assignees: IMEC VZW, Leuven (BE); VRIJE UNIVERSITEIT BRUSSEL, Brussels (BE)

( * ) Notice: Subject to any disclaimer, the term of this patent is extended or adjusted under 35 U.S.C. 154(b) by 0 days.

(21) Appl. No.: 15/621,214

(22) Filed: Jun. 13, 2017

(65) Prior Publication Data

US 2018/0013455 A1  Jan. 11, 2018

(30) Foreign Application Priority Data

Jul. 8, 2016  (EP) .................................. 16178644

(51) Int. Cl.
*H03C 3/09* (2006.01)
*H03C 5/00* (2006.01)
(Continued)

(52) U.S. Cl.
CPC ........... *H04B 1/0475* (2013.01); *H03C 3/095* (2013.01); *H03C 3/0941* (2013.01);
(Continued)

(58) Field of Classification Search
CPC ..................... H04B 1/0475; H04B 2001/0408
See application file for complete search history.

(56) References Cited

U.S. PATENT DOCUMENTS

2002/0093378 A1  7/2002  Nielsen et al.
2004/0108896 A1  6/2004  Midtgaard
(Continued)

FOREIGN PATENT DOCUMENTS

EP  1 217 753 A1  6/2002
EP  1 819 059 A1  8/2007
(Continued)

OTHER PUBLICATIONS

European Search Report, European Patent Application No. 16178644, dated Jan. 24, 2017, 7 pages.
(Continued)

*Primary Examiner* — Shuwang Liu
*Assistant Examiner* — Gina M McKie
(74) *Attorney, Agent, or Firm* — McDonnell Boehnen Hulbert & Berghoff LLP

(57) ABSTRACT

A polar transmitter provided for transmitting a phase/frequency modulated and amplitude modulated transmit signal and a method for generating a transmit signal using a polar transmitter are described. An example polar transmitter comprises a phase locked loop for generating a phase/frequency modulated precursor of the transmit signal. The phase locked loop comprises at its input a phase error detection unit for detecting a phase error of the precursor fed back from the output of the phase locked loop to the phase error detection unit as a feedback signal. The polar transmitter comprises a digital amplitude modulator for amplitude modulation of the precursor, resulting in the transmit signal. The digital amplitude modulator is arranged within the phase locked loop for amplitude modulation of the precursor before being output by the PLL. The phase error detection unit is further provided for detecting the amplitude of the feedback signal.

20 Claims, 9 Drawing Sheets

(51) Int. Cl.
  *H04B 1/04* (2006.01)
  *H04L 7/00* (2006.01)
  *H04B 17/11* (2015.01)
  *H04L 27/36* (2006.01)
  *H04L 7/033* (2006.01)
  *H04L 27/04* (2006.01)
  *H04L 27/152* (2006.01)

(52) U.S. Cl.
  CPC ......... *H03C 3/0966* (2013.01); *H03C 3/0991* (2013.01); *H03C 5/00* (2013.01); *H04L 7/0091* (2013.01); *H04L 7/0331* (2013.01); *H04L 27/04* (2013.01); *H04L 27/152* (2013.01); *H04L 27/366* (2013.01); *H04B 17/11* (2015.01); *H04B 2001/0433* (2013.01); *H04B 2001/0491* (2013.01); *H04L 27/361* (2013.01)

(56) References Cited

U.S. PATENT DOCUMENTS

| | | | |
|---|---|---|---|
| 2005/0242889 A1 | 11/2005 | Mitani et al. | |
| 2006/0067427 A1* | 3/2006 | Zolfaghari | H03F 1/0211 375/297 |
| 2006/0068725 A1* | 3/2006 | Zolfaghari | H03D 7/168 455/126 |
| 2006/0202774 A1 | 9/2006 | Hirano | |
| 2007/0036238 A1* | 2/2007 | Matero | H03C 3/0925 375/296 |
| 2008/0153437 A1 | 6/2008 | Jensen et al. | |
| 2008/0205550 A1 | 8/2008 | Rofougaran | |
| 2013/0052972 A1* | 2/2013 | Gossmann | H04L 27/361 455/115.1 |
| 2015/0145567 A1 | 5/2015 | Perrott | |
| 2017/0324416 A1* | 11/2017 | Jakobsson | H03L 7/0898 |
| 2018/0337683 A1* | 11/2018 | Mateman | H03L 7/0992 |

FOREIGN PATENT DOCUMENTS

| | | |
|---|---|---|
| WO | 01/24356 A1 | 4/2001 |
| WO | 03/005564 A2 | 1/2003 |
| WO | 03/100978 A1 | 12/2003 |
| WO | 2004/045093 A1 | 5/2004 |
| WO | 2006/085585 A1 | 8/2006 |

OTHER PUBLICATIONS

Markulic, Nereo et al., "A 10-bit, 550-fs Step Digital-to-Time Converter in 28nm CMOS", European Solid State Circuits Conference (ESSCIRC), 2014, pp. 79-82.

Marzin, Giovanni et al., "A 20 Mb/s Phase Modulator Based on a 3.6 GHz Digital PLL With −36 dB EVM at 5mW Power", IEEE Journal of Solid-State Circuits, vol. 47, No. 12, Dec. 2012, pp. 2974-2988.

Levantino, Salvatore et al., "An Adaptive Pre-Distortion Technique to Mitigate the DTC Nonlinearity in Digital PLLs", IEEE Journal of Solid-State Circuits, vol. 49, No. 8, Aug. 2014, pp. 1762-1772.

Gao, Xiang et al., "A Low Noise Sub-Sampling PLL in Which Divider Noise is Eliminated and PD/CP Noise is Not Multiplied by N2", IEEE Journal of Solid-State Circuits, No. 44, No. 12, Dec. 2009, pp. 3253-3263.

Raczkowski, Kuba et al., "A 9.2-12.7 GHz Wideband Fractional-N Subsampling PLL in 28 nm CMOS With 280 fs RMS Jitter", IEEE Journal of Solid-State Circuits, vol. 50, No. 5, May 2015, pp. 1203-1213.

\* cited by examiner

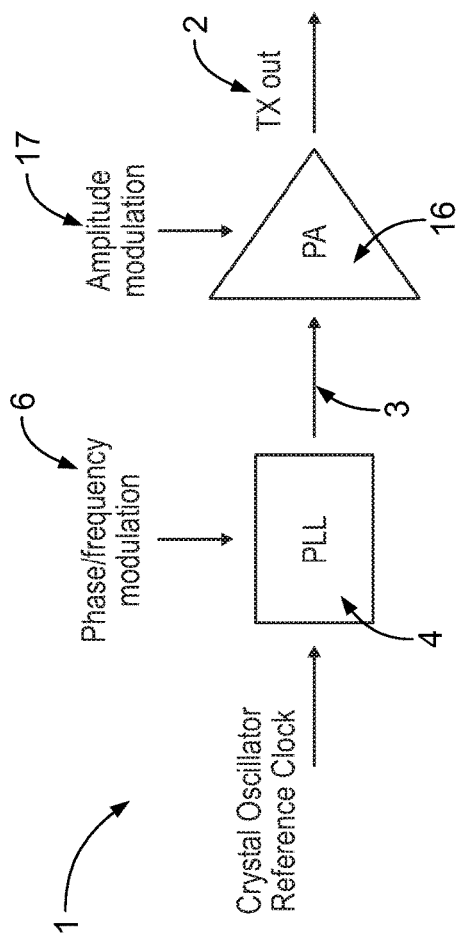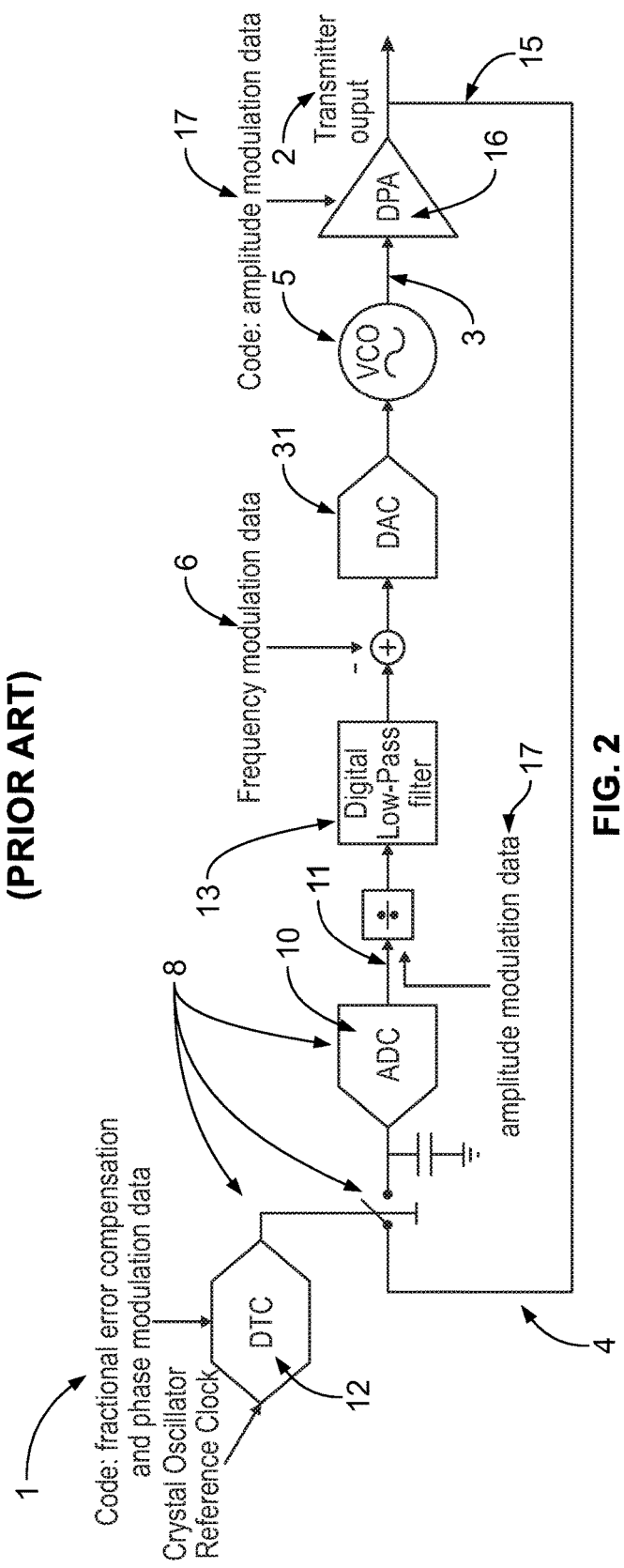
FIG. 1 (PRIOR ART)
FIG. 2

POLAR TRANSMITTER AND METHOD FOR GENERATING A TRANSMIT SIGNAL USING A POLAR TRANSMITTER

CROSS-REFERENCE TO RELATED APPLICATIONS

The present application is a non-provisional patent application claiming priority to EP Patent Application No. 16178644.7, filed Jul. 8, 2016, the contents of which are hereby incorporated by reference.

FIELD OF THE DISCLOSURE

The present disclosure relates to a polar transmitter provided for transmitting a phase/frequency modulated and amplitude modulated transmit signal, and to a method for generating a transmit signal using a polar transmitter.

BACKGROUND

A typical polar transmitter, such as for example described in X. Gao, E. Klumperink, M. Bohsali and B. Nauta, "A Low Noise Sub-Sampling PLL in Which Divider Noise is Eliminated and PD/CP Noise is Not Multiplied by N2", *IEEE Journal of Solid-State Circuits*, vol. 44, no. 12, pp. 3253-3263, 2003, and shown schematically in FIG. 1, consists of a phase/frequency modulating phase-locked loop 4 (PLL) and an amplitude modulating digital power amplifier 16 (DPA) as a digital amplitude modulator (DAM). These two blocks are connected serially as shown in FIG. 1.

WO-A-01/24356 discloses a PLL for phase modulation in radio transmitters. The PLL comprises a DAM and a limiter to remove amplitude information from signal that is fed back into the phase detector in the PLL.

Such polar transmitters have the disadvantage that they are limited by the noise in the system, PLL and DPA bandwidth, both, phase/frequency modulator and DPA linearity. Furthermore, the DPA amplitude modulation can induce parasitic phase/frequency modulation, i.e. AM-to-PM distortion. Also, phase/frequency modulation can result in unwanted amplitude modulation, i.e. PM-to-AM distortion.

SUMMARY

It is an aim of the present disclosure to provide a polar transmitter wherein typical PLL bandwidth limitations are overcome while maintaining phase-noise filtering, and allows on-line calibration of the DAM linearity, phase-error detector linearity and on-line suppression of PM-to-AM and AM-to-PM distortion.

This aim is achieved with a polar transmitter in accordance with example embodiments of the present disclosure.

As used herein, "phase/frequency modulation" is intended to mean phase modulation or frequency modulation of a signal. Hence, a "phase/frequency modulated signal" means a signal which has been modulated in phase or frequency.

The present disclosure provides a polar transmitter provided for transmitting or outputting a phase/frequency modulated and amplitude modulated transmit signal. The polar transmitter comprises a phase locked loop (PLL) for generating a phase/frequency modulated precursor of the transmit signal. The PLL comprises at its input a phase error detection unit for detecting a phase error of a feedback signal which is fed back from the output of the PLL to the phase error detection unit. The polar transmitter comprises a digital amplitude modulator (DAM) for amplitude modulation of the precursor, resulting in transmit signal. The digital amplitude modulator is arranged within the PLL for amplitude modulation of the precursor before being output by the PLL and the feedback signal is the transmit signal or a derivation thereof. The digital amplitude modulator may for example be a digital power amplifier (DPA). The phase error detection unit is further provided for detecting the amplitude of the feedback signal.

Integrating the digital amplitude modulator into the PLL and providing the phase error detection unit for detecting or sensing the amplitude of the feedback signal may provide that instead of only the phase/frequency modulation and any imperfections of the PLL components also the amplitude modulation and any imperfections of the DAM are fed back from the output of the PLL to the phase error detection unit. As such, iterative calibration of the precursor, and thus finally the transmit signal for, for example, nonlinearities in digital to phase/frequency and digital to amplitude conversion and for Phase Modulation to Amplitude Modulation (PM-to-AM) and Amplitude Modulation to Phase Modulation (AM-to-PM) distortions may readily be implemented into the polar transmitter, e.g., in the background while the polar transmitter operates normally.

In an example embodiment, the feedback signal is the transmit signal. Alternatively, the feedback signal may also be a useful derivation of the transmit signal, for example a filtered signal. An example is a sharp band-pass filter around the fundamental local oscillator frequency with bandwidth equal to the modulation bandwidth, so that the phase error detection unit only senses the part of the spectrum of interest. Another example of a block that could be used in the feedback path is another amplitude modulator which would compensate for the amplitude modulation of the output signal through the DPA. This block would then apply an inverse of the DPA modulation signal so that the phase error detection unit always senses the same amplitude.

In an embodiment of the polar transmitter according to the present disclosure, the digital amplitude modulator is arranged at the output of the PLL.

Arranging the digital amplitude modulator at the output of the PLL may provide that the amplitude modulated precursor, thus the transmit signal, may directly be fed back to the phase detection unit at the input of the PLL, without any further amplitude modulation of the transmit signal, which might introduce additional errors further complicating any calibration of the transmit signal within the PLL.

In an embodiment of the polar transmitter according to the present disclosure, the phase error detection unit is provided for sub-sampling at a reference rate of the feedback signal.

Sub-sampling at a reference rate of the feedback signal may provide both phase error information and amplitude information from the feedback signal, and thus the transmit signal, without requiring separate detection mechanisms.

In an embodiment of the polar transmitter according to the present disclosure, the phase error detection unit comprises an analog-to-digital convertor (ADC) for generating a phase error code proportional to the phase error and the amplitude of the feedback signal.

In an embodiment of the polar transmitter according to the present disclosure, the PLL is a sub-sampling PLL. The PLL comprises a controllable oscillator for generating the precursor by means of a frequency modulation input signal. The PLL comprises the digital amplitude modulator for amplitude modulation of the precursor by means of an amplitude modulation signal. The PLL comprises a phase error detection unit. The phase error detection unit is provided for sub-sampling at a reference rate of the feedback signal. The phase error detection unit is provided for generating a phase error code proportional to the sub-sampled feedback signal by means of an ADC. The phase error code is used for adjusting the phase of the precursor generated by the controllable oscillator. In an example embodiment, the phase error detection unit comprises a Digital-to-Time Converter (DTC) for delaying the sub-sampling of the feedback signal to enable phase modulation of the precursor and/or fractional residue compensation. In an example embodiment, the DTC is a DTC with a known quantization accuracy, hence a known Least-Significant-Bit, LSB expressed in seconds.

The use of the sub-sampling PLL arranged as such may provide that calibration of the transmit signal may readily be implemented in the digital domain and run in the background while the polar transmitter operates normally.

In an embodiment of the polar transmitter according to the present disclosure, the PLL is arranged for rescaling the phase error code by means of the amplitude modulation signal.

This embodiment may provide that the a constant loop gain is maintained in the part of the PLL following the phase error detection unit, such that the operating range of the part of the PLL following the phase error detection unit does not need to be adapted to the amplitude changes of the precursor caused by the amplitude modulation by means of the digital amplitude modulator.

In an embodiment of the polar transmitter according to the present disclosure, the polar transmitter comprises a calibration loop for calibration of the transmit signal for predetermined phase shifts. The calibration loop is provided for calculating the phase error detection gain defined by the controllable oscillator output amplitude, the DAM gain and the ADC gain. The phase error detection gain is iteratively calculated from the correlation between the predetermined phase shift and an error signal. The error signal is derived from the phase error code by subtracting the predetermined phase shift scaled by the calculated phase error detection gain. In an example embodiment, the correlation between the predetermined phase shift and the error signal is obtained by multiplying the predetermined phase shift with the error signal and by integrating the multiplication result.

In an example embodiment, the phase error detection gain can be estimated in the background while the polar transmitter operates normally by using the correlation between the predetermined phase shift and the error signal. The error signal is calculated in every reference cycle as the phase error code from the ADC corrected for the predetermined phase shift scaled by an estimate of the phase error detection gain. In case the correct estimate for the phase error detection gain is known, there is no correlation between the predetermined phase shift and the error signal from which the predetermined phase shift is removed. If the correct estimate of the phase error detection gain is, however, not known, correlation between the predetermined phase shift and the error signal does exist. This correlation can be used to calculate phase error detection gain in the background while the polar transmitter operates normally. The phase error detection gain is iteratively calculated by multiplying the predetermined phase shift with the error signal and by integrating the multiplication result. Iterative repetition of this process results in an accurate estimate of the phase error detection gain and hence to an effective removal of any predetermined phase shift present in the error signal.

In an embodiment of the polar transmitter according to the present disclosure, the predetermined phase shift is one of a known quantization error of a component of the polar transmitter and a phase shift especially induced by a phase modulating component of the polar transmitter for the purpose of calibrating the transmit signal.

In an embodiment of the polar transmitter according to the present disclosure, the calibration loop is provided for calibration of the transmit signal for DAM nonlinearity. Therefore, the amplitude modulation signal is corrected with a DAM nonlinearity correction value from DAM nonlinearity correction values stored in a DAM nonlinearity look-up-table (LUT). The DAM nonlinearity correction values are derived from the amplitude modulation signal and the product of the predetermined phase shift and the error signal. The DAM nonlinearity LUT is iteratively updated by means of the product of the predetermined phase shift and the error signal. The amplitude modulation signal is used for continuous addressing of the DAM nonlinearity LUT.

In an example embodiment, the DAM nonlinearity can be estimated in the background while the polar transmitter operates normally by using the correlation between the product of the predetermined phase shift and the error signal on the one side and the amplitude modulation signal on the other side for updating a DAM nonlinearity LUT. The DAM nonlinearity LUT may be used to retrieve a DAM nonlinearity correction value for a certain amplitude modulation signal. This DAM nonlinearity correction value is then used for pre-distorting the amplitude modulation signal to remove the influence from the DAM nonlinearity from the transmit signal. In case of a linear DAM and if the correct value for the phase error detection gain is known, the product of the predetermined phase shift and the error signal for updating the LUT is completely independent of a particular amplitude modulation signal and has a zero mean value. Hence, in an example, no correction is applied to the amplitude modulation signal. In case of a nonlinear DAM, however, the product updates the LUT with a non-zero stream, and hence the amplitude modulation signal is pre-distorted by the DAM nonlinearity correction value retrieved from the LUT.

The use of the LUT and the simple calculation for updating the LUT may provide that the transmit signal may be calibrated for DAM nonlinearity in the background, without thereby disturbing the normal operation of the polar transmitter.

In an embodiment of the polar transmitter according to the present disclosure, the calibration loop is provided for calibration of the transmit signal for ADC nonlinearity. Therefore, the error signal is corrected with an ADC nonlinearity correction value from ADC nonlinearity correction values stored in an ADC nonlinearity LUT. The ADC nonlinearity correction values are derived from the phase error code and the corrected error signal. The ADC nonlinearity LUT is iteratively updated by means of the corrected error signal. The phase error code is used for continuous addressing of the ADC nonlinearity LUT.

In an example embodiment, the ADC nonlinearity can be estimated in the background while the polar transmitter operates normally by using the correlation between the error signal corrected for ADC nonlinearity and the phase error code output of the ADC for updating an ADC nonlinearity LUT. The ADC nonlinearity LUT may be used to retrieve an ADC nonlinearity correction value for a certain phase error code. This ADC nonlinearity correction value is then used for post-distorting the error signal to remove the influence from the ADC nonlinearity from the transmit signal. In case of a linear ADC the corrected error signal for updating the LUT is completely independent of a particular phase error code and has a zero mean value. Hence, in an example, no correction is applied to the error signal. In case of a nonlinear ADC, however, the corrected error signal updates the LUT with a non-zero stream, and hence the error signal is post-distorted by the ADC nonlinearity correction value retrieved from the LUT.

The use of the LUT and the simple calculation for updating the LUT may provide that the transmit signal may be calibrated for ADC nonlinearity in the background, without thereby disturbing the normal operation of the polar transmitter.

In an embodiment of the polar transmitter according to the present disclosure, the calibration loop is provided for calibration of the transmit signal for amplitude modulation to phase modulation distortion, AM-to-PM distortion. Therefore, the frequency modulation signal is corrected by a frequency modulation correction value from frequency modulation correction values stored in an AM-to-PM distortion LUT. The frequency modulation correction values are derived from the amplitude modulation signal and the error signal. The AM-to-PM distortion LUT is iteratively updated by means of the error signal. The amplitude modulation signal is used for continuous addressing of the AM-to-PM distortion LUT.

In an example embodiment, the AM-to-PM transfer function can be estimated in the background while the polar transmitter operates normally by using the correlation between the error signal and the amplitude modulation signal for updating an AM-to-PM distortion LUT. The AM-to-PM distortion LUT may be used to retrieve a frequency modulation correction value for a certain amplitude modulation signal. This frequency modulation correction value is then used for pre-distorting the frequency modulation signal to remove the influence from the DAM on the frequency modulation of the transmit signal. In case the DAM has no influence on the frequency modulation of the precursor, and thus the transmit signal, then the error signal for updating the LUT is completely independent of a particular amplitude modulation signal and has thus a zero mean value. Hence, in an example, no correction is applied to the frequency modulation signal. In case of the DAM having an influence on the frequency modulation of the precursor, and thus the transmit signal, however, the error signal updates the LUT with a non-zero stream, and hence the frequency modulation signal is pre-distorted by the frequency modulation correction value retrieved from the LUT.

The use of the LUT and the simple calculation for updating the LUT may provide that the transmit signal may be calibrated for AM-to-PM distortion in the background, without thereby disturbing the normal operation of the polar transmitter.

In an embodiment of the polar transmitter according to the present disclosure, the calibration loop is provided for calibration of the transmit signal for phase modulation to amplitude modulation distortion, PM-to-AM distortion. Therefore, the amplitude modulation signal is corrected by an amplitude modulation correction value from amplitude modulation correction values stored in a PM-to-AM distortion LUT. The amplitude modulation correction values are derived from the frequency modulation signal and the product of the predetermined phase shift and the error signal. The PM-to-AM distortion LUT is iteratively updated by means of the product of the predetermined phase shift and the error signal. The frequency modulation signal is used for continuous addressing of the PM-to-AM distortion LUT.

In an example embodiment, the PM-to-AM transfer function can be estimated in the background while the polar transmitter operates normally by using the correlation between the product of the predetermined phase shift and error signal on the one side and the frequency modulation signal on the other side for updating a PM-to-AM distortion LUT. The PM-to-AM distortion LUT may be used to retrieve an amplitude modulation correction value for a certain frequency modulation signal. This amplitude modulation correction value is then used for pre-distorting the amplitude modulation signal to remove the influence from the controllable oscillator on the amplitude modulation of the precursor, and thus the transmit signal. In case the controllable oscillator has no influence on the amplitude modulation of the precursor, and thus transmit signal, the product of the predetermined phase shift and the error signal for updating the LUT is completely independent of a particular frequency modulation signal and has thus a zero mean value. Hence, in an example, no correction is applied to the amplitude modulation signal. In case of the controllable oscillator having an influence on the amplitude modulation of the precursor, and thus the transmit signal, however, the product of the predetermined phase shift and the error signal updates the LUT with a non-zero stream, and hence the amplitude modulation signal is pre-distorted by the amplitude modulation correction value retrieved from the LUT.

The use of the LUT and the simple calculation for updating the LUT may provide that the transmit signal may be calibrated for PM-to-AM distortion in the background, without thereby disturbing the normal operation of the polar transmitter.

In an embodiment of the polar transmitter according to the present disclosure, the correlation value for calculating the phase error detection gain and/or the value for updating the LUT is scaled by a scaling factor for controlling the convergence speed of the calibration of the transmit signal. The correlation value for calculating the phase error detection gain is the correlation between the predetermined phase shift and the error signal. The value for updating the LUT is the product of the predetermined phase shift and the error signal in case of the DAM nonlinearity LUT, the corrected error signal in case of the ADC nonlinearity LUT, the error signal in case of the AM-to-PM distortion LUT, and the product of the predetermined phase shift and the error signal in case of the PM-to-AM distortion LUT.

The use of the scaling factor may provide a simple and quick control on the speed with which the transmit signal may be calibrated.

Furthermore, the present disclosure provides a method for generating a phase/frequency modulated and amplitude modulated transmit signal by means of a polar transmitter. A phase/frequency modulated precursor of the transmit signal is generated by means of a phase locked loop (PLL) of the polar transmitter. A phase error detection unit of the PLL is used for detecting a phase error of a feedback signal which is fed back from the output of the PLL to the phase error detection unit. Amplitude modulation of the precursor is done by means of a digital amplitude modulator (DAM) of the polar transmitter, resulting in the transmit signal. The digital amplitude modulator may for example be a digital power amplifier (DPA). The amplitude modulation of the precursor by means of the digital amplitude modulator is done within the PLL, i.e. before the output of the PLL. The feedback signal which is taken is the transmit signal or derived therefrom. The phase error detection unit is further used for detecting the amplitude of the feedback signal.

The aspects of the method according to the present disclosure and its embodiments are similar to those discussed with respect to the polar transmitter according to the present disclosure and its embodiments.

In an embodiment of the method according to the present disclosure, the amplitude modulation of the precursor by means of the digital amplitude modulator is done at the output of the PLL.

In an embodiment of the method according to the present disclosure for operating the polar transmitter according to the present disclosure comprising the calibration loop, the transmit signal is calibrated for predetermined phase shifts by calculating the error signal by subtracting from the phase error code the predetermined phase shift scaled by a first estimate of the phase error detection gain defined by the controllable oscillator output amplitude, the DAM gain and the ADC gain, by calculating a further estimate of the phase error detection gain from the correlation between the predetermined phase shift and the error signal, and by iteratively repeating the above steps using the further estimate of the phase error detection gain until saturation, i.e. when the product of the predetermined phase shift and the error signal becomes a zero mean signal.

In an embodiment of the method according to the present disclosure for operating the polar transmitter according to the present disclosure comprising the calibration loop, the predetermined phase shift is one of a known quantization error of a component of the polar transmitter and a phase shift especially induced by a phase modulating component of the polar transmitter for the purpose of calibrating the transmit signal.

In an embodiment of the method according to the present disclosure for operating the polar transmitter according to the present disclosure comprising the calibration loop, the transmit signal is further calibrated for DAM nonlinearity by retrieving a DAM nonlinearity correction value by addressing a DAM nonlinearity LUT with the amplitude modulation signal, by correcting the amplitude modulation signal by subtracting the retrieved DAM nonlinearity correction value, by updating the DAM nonlinearity LUT by means of the product of the predetermined phase shift and the error signal, and by iteratively repeating the above steps until saturation of the DAM nonlinearity LUT. The DAM nonlinearity LUT stores DAM nonlinearity correction values derived from the amplitude modulation signal and the product of the predetermined phase shift and the error signal.

In an embodiment of the method according to the present disclosure for operating the polar transmitter according to the present disclosure comprising the calibration loop, the transmit signal is further calibrated for ADC nonlinearity by retrieving an ADC nonlinearity correction value by addressing an ADC nonlinearity LUT with the phase error code, by correcting the error signal by subtracting the retrieved ADC nonlinearity correction value, by updating the ADC nonlinearity LUT by means of the corrected error signal, and by iteratively repeating the above steps until saturation of the ADC nonlinearity LUT. The ADC nonlinearity LUT stores ADC nonlinearity correction values derived from the phase error code and the corrected error signal.

In an embodiment of the method according to the present disclosure for operating the polar transmitter according to the present disclosure comprising the calibration loop, the transmit signal is further calibrated for AM-to-PM distortion by retrieving a frequency modulation correction value by addressing an AM-to-PM distortion LUT with the amplitude modulation signal, by correcting the frequency modulation signal by subtracting the retrieved frequency modulation correction value, by updating the AM-to-PM distortion LUT by means of the error signal, and by iteratively repeating the above steps until saturation of the AM-to-PM distortion LUT. The AM-to-PM distortion LUT stores frequency modulation correction values derived from the amplitude modulation signal and the error signal.

In an embodiment of the method according to the present disclosure for operating the polar transmitter according to the present disclosure comprising the calibration loop, the transmit signal is further calibrated for PM-to-AM distortion by retrieving an amplitude modulation correction value by addressing a PM-to-AM distortion LUT with the frequency modulation signal, by correcting the amplitude modulation signal by subtracting the retrieved amplitude modulation correction value, by updating the PM-to-AM distortion LUT by means of the product of the predetermined phase shift and the error signal, and by iteratively repeating the above steps until saturation of the PM-to-AM distortion LUT. The PM-to-AM distortion LUT stores amplitude modulation correction values derived from the frequency modulation signal and the product of the predetermined phase shift and the error signal.

In an embodiment of the method according to the present disclosure, the correlation value for calculating the phase error detection gain and/or the value for updating the LUT is scaled by a scaling factor for controlling the convergence speed of the calibration of the transmit signal.

BRIEF DESCRIPTION OF THE FIGURES

The above, as well as additional, features will be better understood through the following illustrative and non-limiting detailed description of example embodiments, with reference to the appended drawings.

FIG. 1 shows a polar transmitter according to prior art.

FIG. 2 shows an embodiment of a polar transmitter, according to an example embodiment of the present disclosure.

DETAILED DESCRIPTION

Figure 3:
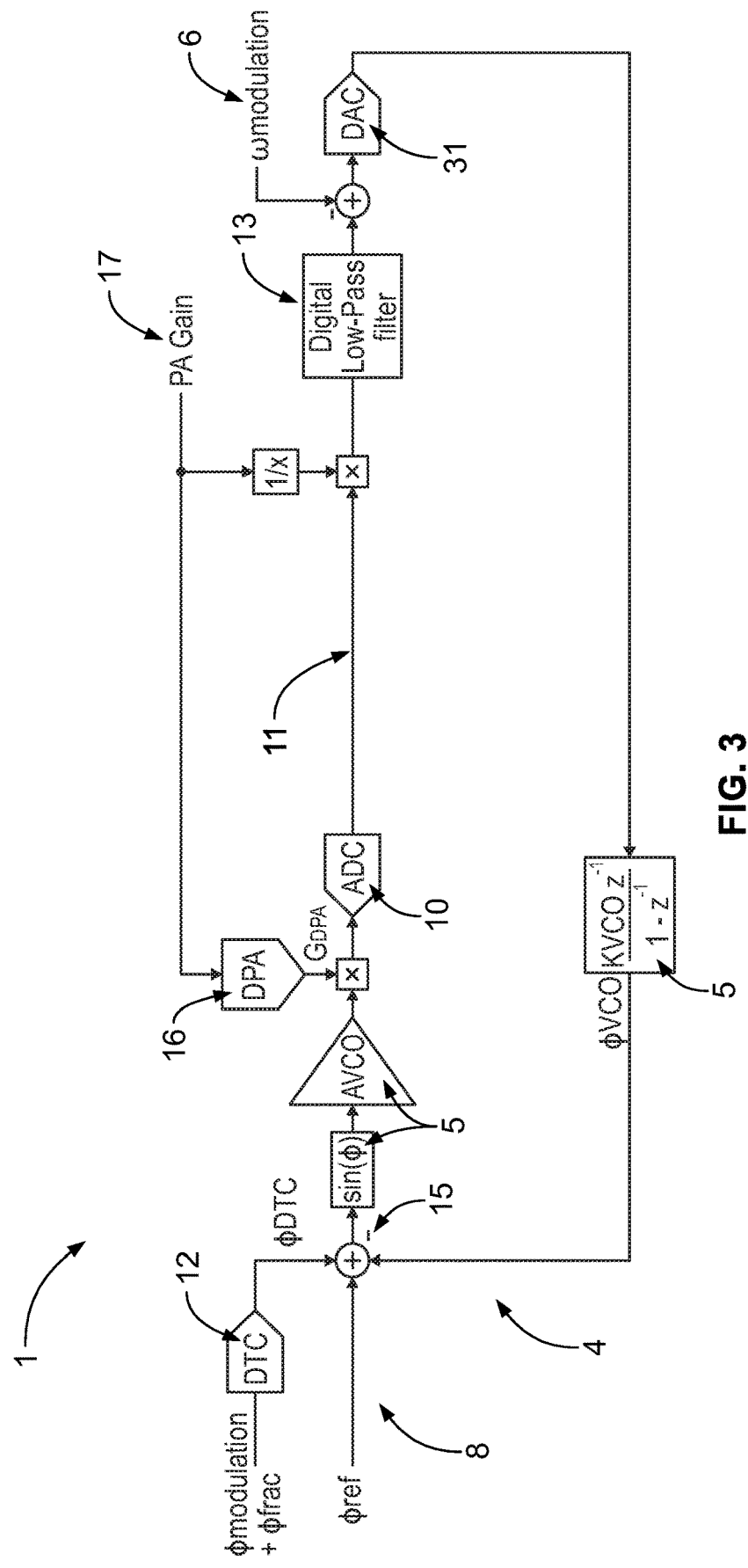
FIG. 3 shows a representation of the polar transmitter of FIG. 2 in the phase domain, according to an example embodiment.

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the disclosure.

Furthermore, the terms first, second, third and the like in the description and in the claims, are used for distinguishing between similar elements and not necessarily for describing a sequential or chronological order. The terms are interchangeable under appropriate circumstances and the embodiments of the disclosure can operate in other sequences than described or illustrated herein.

Moreover, the terms top, bottom, over, under and the like in the description and the claims are used for descriptive purposes and not necessarily for describing relative positions. The terms so used are interchangeable under appropriate circumstances and the embodiments of the disclosure described herein can operate in other orientations than described or illustrated herein.

Furthermore, the various embodiments are to be construed as exemplary manners in which the disclosure may be implemented rather than as limiting the scope of the disclosure.

The term "comprising", used in the claims, should not be interpreted as being restricted to the elements or steps listed thereafter; it does not exclude other elements or steps. It needs to be interpreted as specifying the presence of the stated features, integers, steps or components as referred to, but does not preclude the presence or addition of one or more other features, integers, steps or components, or groups thereof. Thus, the scope of the expression "a device comprising A and B" should not be limited to devices consisting only of components A and B, rather with respect to the present disclosure, the only enumerated components of the device are A and B, and further the claim should be interpreted as including equivalents of those components.

A simplified block diagram of a Digital Sub-Sampling Polar Transmitter 1 (DSSTx) according to an embodiment of the present disclosure is depicted in FIG. 2. The transmitter 1 (TX) is based on a digitized Fractional-N Sub-Sampling PLL 4 (FNSSPLL) and a digitally tuneable gain power amplifier 16 (DPA) as a digital amplitude modulator. In an example embodiment, the DPA is placed at the output of the PLL 4, and thus serves to close the PLL 4.

The transmitter 1 operates as a Sub-Sampling PLL 4 (SSPLL) when there is no modulation. The high frequency output sinewave of the voltage controlled oscillator 5 (VCO) is first amplified by a constant gain DPA 16 and then directly (no division) sub-sampled at the low-frequency reference rate. If there is no mismatch between the input and the output phase, the VCO output sinewave zero-crossings are sub-sampled, i.e. the ADC 10 outputs a zero. If, however, there is some mismatch between the output and the input phase, a non-zero voltage is sub-sampled, and the ADC 10 produces as output code a phase error code 11, linearly proportional to the phase error. This phase error code 11 is digitally low-pass filtered by the low-pass filter 13 (LPF) and sent through a digital-to-analog converter 31 (DAC) to adjust the VCO output phase (forcing a zero phase offset condition). The Digital-to-Time Converter 12 (DTC) is completely transparent during integer-N PLL operation (integer multiplication of the input frequency), while, in fractional-N operation mode, it serves for fractional residue compensation. In other words, the DTC 12 delays the sampling instant by a predetermined delay to force near-to-zero voltage sample during a fractional-N lock.

Notably, the proposed architecture has a linear phase error detection gain defined by:

$$G_{PD} = AVCO \cdot G_{DPA} \cdot G_{ADC}, \quad (1)$$

where AVCO is the VCO output sinewave amplitude, $G_{DPA}$ is the DPA gain and $G_{ADC}$ is the gain of the ADC 10. The $G_{PD}$ can be set high enough to suppress the in-loop phase-noise (sampler noise) well below the reference and the VCO phase noise contribution. In an example, a sub-sampling PLL 4 has no divider (and hence no divider originated noise) which results in a better phase noise performance compared to classical analog or digital PLL. The high detection gain imposes no issues with loop stability since the digital low-pass filter 13 is easily adjusted (the analog filter equivalent would potentially need a large, area consuming capacitor).

PLL architectures based on a fractional-N sub-sampling phase error detection, for example as described in K. Raczkowski, N. Markulic, B. Hershberg, J. Van Driessche and J. Craninckx, "A 9.2-12.7 GHz Wideband Fractional-N Subsampling PLL in 28 nm CMOS with 280 fs RMS jitter", in *Radio Frequency Integrated Circuits Symposium*, 201, have been used up to now for phase/frequency modulation only. In those architectures the phase/frequency modulation bandwidth is not limited by the PLL filtering since a two point-injection scheme similar to G Marzin, S. Levantino, C. Samori and A. L. Lacaita, "A 20 Mb/s phase modulator based on a 3.6 GHz digital PLL with −36 dB EVM at 5 mW power", *IEEE Journal of Solid-State Circuits*, vol. 47, no. 12, pp. 2974-2988, 2012 (hereinafter referred to as Marzin et al.) can be used. This is achieved by sending the same frequency modulation data, but with an opposite sign, expressed as accumulated phase, to the DTC which then re-adjusts the delay for zero-crossing sampling (letting the modulated phase/frequency through). Namely, the frequency modulation data sent to the PLL output is ignored by the phase-error detector, i.e. the sampler. This also allows to background calibrate for potential DTC/DAC gain mismatch and delay spread (see Marzin et al.) and DTC/DAC integral non-linearity (INL) as disclosed in S. Levantino, G Marzin and C. Samori, "An adaptive pre-distortion technique to mitigate the DTC nonlinearity in digital PLLs", *IEEE Journal of Solid-State Circuits*, vol. 49, no. 8, pp. 1762-1772, 2014.

Herein, it is proposed to use this architecture for amplitude modulation also. This is achieved by including a DPA 16 in the SSPLL 4, as shown in FIG. 2, wherein DPA acts as an amplitude modulator. The sampled voltage hence contains both amplitude and phase information, partly from intended AM and PM modulation, and partly from imperfections in the system. As a result, the phase detection mechanism in the SSPLL 4 becomes sensitive to the amplitude of the output signal as well, and it can also be used to monitor, control, and/or correct the amplitude modulation of a polar transmitter 1 in addition to the phase/frequency modulation.

In an example embodiment, the proposed polar transmitter allows to use the information available in the output signal 11 of the phase detector 8 to monitor and control the gain of the blocks in the transmitter, and to characterize and correct imperfections such as nonlinearities, AM-to-PM distortion, PM-to-AM distortion, etc. For this purpose, several algorithms are described herein, which may be run either in background or in foreground, thereby ensuring a high-quality modulated output 2.

FIG. 3 depicts a phase-domain model of the Digital Sub-Sampling Polar Transmitter 1 of FIG. 2. The VCO 5 is modeled as a digital integrator that is driven by a DAC 31. The sub-sampling of the VCO output $\phi_{VCO}$ is modeled as subtraction of the VCO phase ($\phi_{VCO}$) and the reference phase ($\phi_{REF} + \phi_{DTC}$). In actual implementation, the subsampling is carried out at the DPA output, but for the phase-domain model it is assumed that the DPA 16 does not change the instantaneous VCO phase, i.e. that the $\phi_{VCO} = \phi_{DPA}$. $\phi_{DTC}$ represents the phase modulation signal plus the fractional residue compensation signal (necessary during a fractional lock). If there is no mismatch between the input and the output phase, ideally, the result of this subtraction is zero; however, since the DTC 12 has limited resolution, a phase quantization error 19 (see FIGS. 4-8) is produced.

The phase quantization error 19 (which may contain a random, noise originated phase error) is then transferred into the voltage domain by sub-sampling. The sub-sampling is modelled with the following expression ($V_{sample}$ is the voltage value received at the ADC input):

$$V_{sample} = AVCO \cdot G_{DPA} * \sin(\phi_{VCO} - \phi_{REF} - \phi_{DTC}). \quad (2)$$

The DPA gain ($G_{DPA}$) is constant if there is no amplitude modulation in the transmitter 1. However, during amplitude modulation, the DPA gain is changing (w.r.t. the DPA Gain code 17, i.e. the amplitude modulation signal), which results in scaling of the sub-sampled voltage 9, accordingly. The ADC 10 quantizes the sub-sampled voltage level—producing a digital code 11. To maintain a constant loop gain (during amplitude modulation) the ADC digital output 11 is rescaled with (i.e. divided by) the amplitude of the modulation data 17, as shown in the FIG. 3. Finally, the rescaled ADC output is filtered through the digital low-pass-filter 13. The frequency modulation data 6 (equivalent to the DTC phase modulation data input, with opposite sign) is added to the LPF output. The resulting signal drives a DAC 31, which adjust the DPA output in a zero phase offset condition w.r.t. the input phase.

Background Calibration Mechanisms

Estimation and Calibration of the Phase-Error Detection Gain

The phase-error detection gain ($G_{PD}$) is a value dependent on analog settings of the PLL 4, which are difficult to accurately determine in the design phase. Added to FIG. 4 with respect to FIG. 3, the calibration loop 181 is shown which enables tracking of the phase-error detection gain ($G_{PD}$) in the background, while the polar transmitter 1 operates normally.

The phase-error detector gain estimation is based on correlation of a predetermined phase shift 19, in this case the DTC quantization error 19, with the ADC output data stream, i.e. the error signal 20. The predetermined phase shift may, however, be any other suitable phase shift that is present or especially induced for calibration purposes in the signals of the polar transmitter 1. The predetermined phase shift may, for example, also be a DAC quantization error or a quantization error of another component of the polar transmitter 1. The predetermined phase shift may, for example, also be a phase shift especially induced for calibration purposes by phase modulating components of the polar transmitter 1, such as the DAC 31 of the DTC 12.

Figure 4:
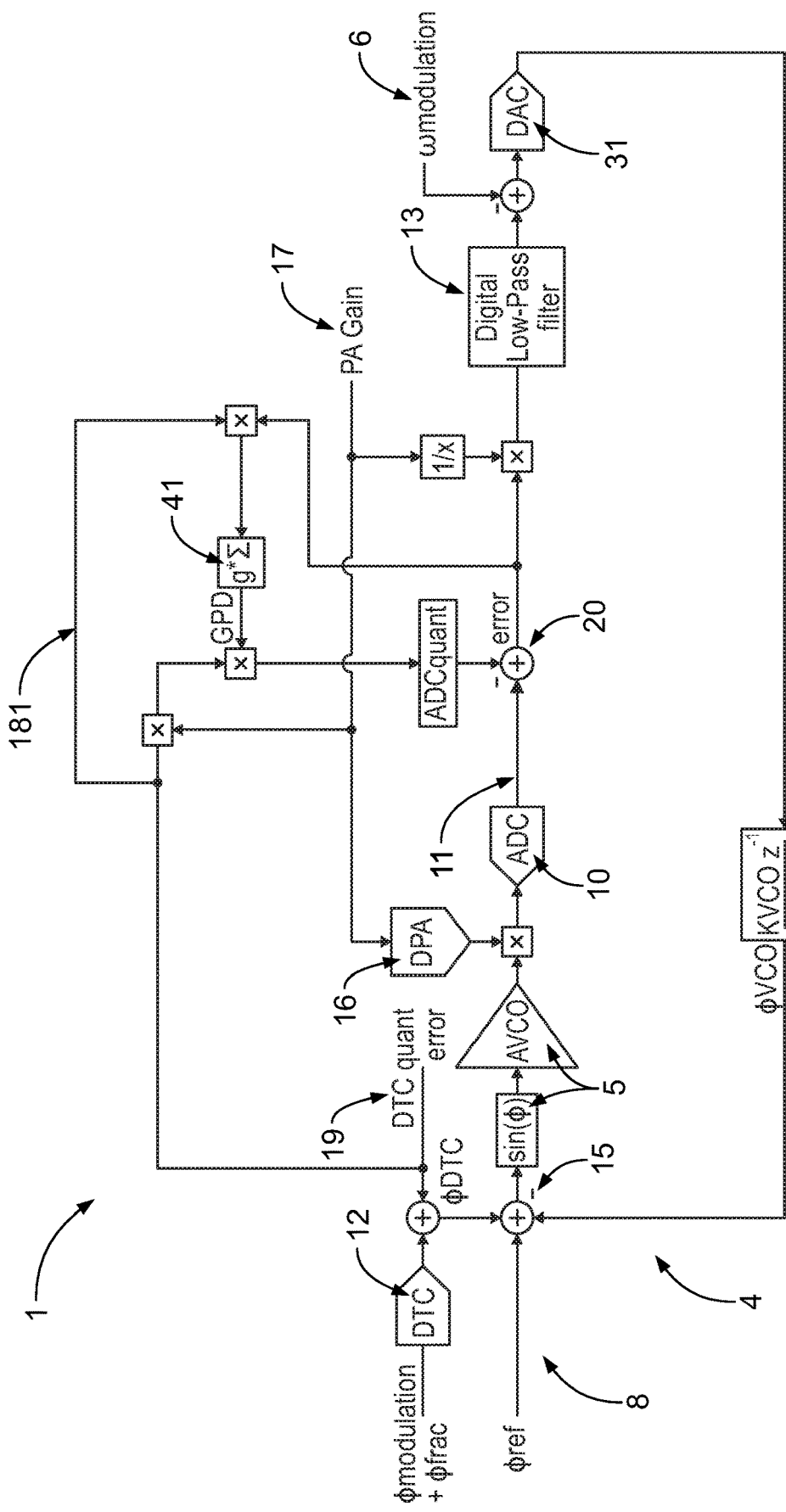
FIG. 4 shows a further embodiment of the polar transmitter of FIG. 3, according to an example embodiment.
Figure 5:
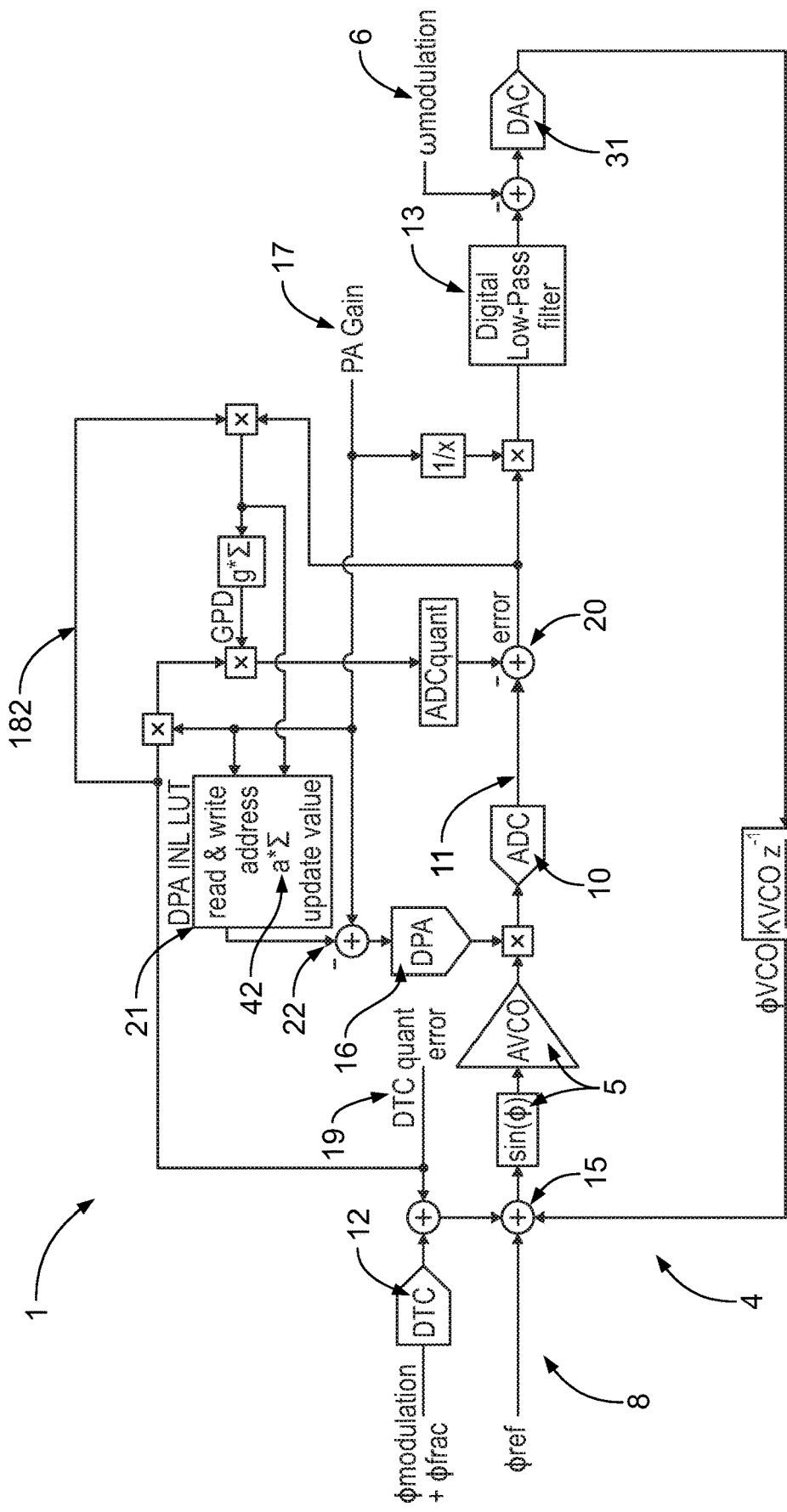
FIG. 5 shows a further embodiment of the polar transmitter of FIG. 4, according to an example embodiment.

The algorithm is based on the following: since the exact quantization error 19 introduced by the DTC 12 (in every sampling event) is known (in the digital domain), it is possible to simply subtract the same phase-error 19 (appropriately scaled by $G_{PD}$) from the ADC output 11 (as depicted in FIG. 4). The error signal 20 is then "clean" of the DTC quantization error 19, and contains just the random noise originated phase error information. Hence, if the $G_{PD}$ factor is determined accurately, the error signal 20 in FIG. 4 is completely uncorrelated with the DTC quantization error 19. If this is not the case, i.e. if there exists some correlation between the DTC quantization error 19 and the error signal 20, the value of the $G_{PD}$ needs to be re-adjusted. To estimate $G_{PD}$ in the background, the quantization error 19 is multiplied with the error signal 20 and the multiplication result is integrated, which directly realizes correlation estimation between the two signals. The integrator output is set to an initial $G_{PD}$ estimate, and then changes towards the positive, or negative infinity (depending on the initial estimate error sign), until it saturates in the real $G_{PD}$ value. In an example embodiment, the multiplication result may be scaled with a factor g 41 which controls the convergence speed of the $G_{PD}$ estimation. The settled $G_{PD}$ estimate is a measure of the phase error detection gain. An unwanted $G_{PD}$ value can be corrected by rescaling the ADC output with a fixed value, by changing the VCO oscillation amplitude or by readjusting the DPA gain.

Calibration of DPA Nonlinearity

A nonlinear DPA 26 can significantly degrade the overall transmitter performance. A DSSTx 1 allows background calibration of the DPA nonlinearity, since, in this architecture specifically, the phase error detector gain depends also on the DPA gain, since the DPA 26 is within the phase-locked loop 4.

The integral nonlinearity (INL) of the DPA is estimated based on correlation of the DTC quantization error 19 and the product of the phase error signal 20 with a particular DPA code 17. A possible way to realize the estimation is by application of a DPA INL look-up-table (LUT). The multiplication product of the DTC quantization error 19 and the phase error signal 20 is accumulated in every reference cycle to a particular DPA INL LUT 21 address (see parts added in FIG. 5 with respect to FIG. 4). The LUT address to which the new value is accumulated in every reference cycle is determined with the instantaneous DPA code.

In case of a correct $G_{PD}$ (this is inherent since the previous calibration algorithm is turned on) and a linear DPA 16, the DTC quantization error 19 and the error signal 20 product has a zero mean value per particular DPA Gain 17. This results in a LUT 21 which accumulates zeros to every of the LUT addresses. For a nonlinear DPA 16, however, the LUT 21 is updated in every cycle with non-zero mean values per particular address (or DPA Gain). Therefore, the values in the LUT 21 drift towards more positive or negative numbers depending on the DPA INL error sign and saturate at an appropriate INL estimate. The LUT values are simultaneously used for estimation and correction (digital pre-distortion) of the DPA nonlinearity. This is realized by subtracting the INL error 22 for the respective DPA code 17 (i.e. the INL value stored at the corresponding LUT address) from the original DPA code 17 (see FIG. 5), hence, removing the nonlinearity of the DPA 16 in the digital domain (pre-distortion).

Each value used to update the appropriate LUT address, i.e. each value accumulated to the appropriate LUT address for INL estimation, may be scaled with a factor a 42 which controls the convergence speed of the DPA INL error estimation. The estimation of the DPA INL and the correction/pre-distortion may be run in the background or in the foreground, together with the previous calibration algorithm, while the transmitter 1 operates normally.

Calibration of the ADC Nonlinearity

The ADC 10 in the DSSTx 1 is part of the phase-error detection chain 8 and can be nonlinear as well, which results in a potential performance degradation, e.g. because of unwanted PLL gain/bandwidth modulation and/or potential calibration accuracy degradation. For this reason there is proposed herein an on-line ADC nonlinearity calibration (see parts of FIG. 6 added with respect to FIG. 5).

The calibration is based on estimating the correlation between the corrected error signal 25 and appropriate ADC output codes 11. In the case of a linear ADC 10 the error signal 20 and hence the corrected error signal 25 are independent of the particular ADC output code 11, without the correction being applied at all. This is because the DTC quantization error 19 gets accurately removed from the ADC output code 11 and only zero mean random noise and zero mean ADC quantization noise remain in the error signal 20 per particular ADC output code 11.

In case of a nonlinear ADC 10, the error signal 20 is influenced by the ADC INL. Indeed, subtracting the DTC quantization error 19 from the ADC output code 11 does not result in the error signal 20 being a random zero mean signal per particular ADC output code 11. In fact, the resulting signal is heavily influenced by a nonlinear ADC. Herein, it is proposed to use a LUT 23 which stores values that represent the ADC INL, to compensate for this effect. The correction values stored in the ADC INL LUT 23 at appropriate addresses defined with ADC output code 11 are subtracted from the error signal 20. In case of a perfect INL error cancellation, i.e. in case of an accurate ADC INL estimate in the ADC INL LUT 23, the corrected error signal 25 is a zero-mean signal per particular ADC output code 11. For an imperfect cancellation this is not true and, hence, the LUT 23 needs to be updated. In every cycle, the instantaneous corrected error signal value 25 is added at the appropriate write address in the ADC INL LUT 23. The write address is calculated based on the DTC quantization error 19 scaled by the phase error detection gain. This forces a drift of the LUT coefficients towards values which represent the ADC INL correctly.

In an example embodiment, the corrected error signal 25 value may be scaled with a factor b 43, before its addition to the appropriate address, to control the algorithm convergence speed. Again, the calibration algorithm runs in the background, together with the calibrations described above while the DSSTx 1 runs normally. Alternatively, the ADC nonlinearity calibration may also be run in the foreground.

Suppression of the AM-to-PM Distortion

For the phase-domain model of the transmitter 1, it was assumed that the DPA 16 modulates the amplitude and has no influence on phase. In an actual implementation, this is not the case, because the amplitude modulation typically induces some unwanted phase/frequency modulation. This effect is known as amplitude-to-phase distortion (AM-to-PM distortion) and can significantly degrade the transmitting quality.

Figure 6:
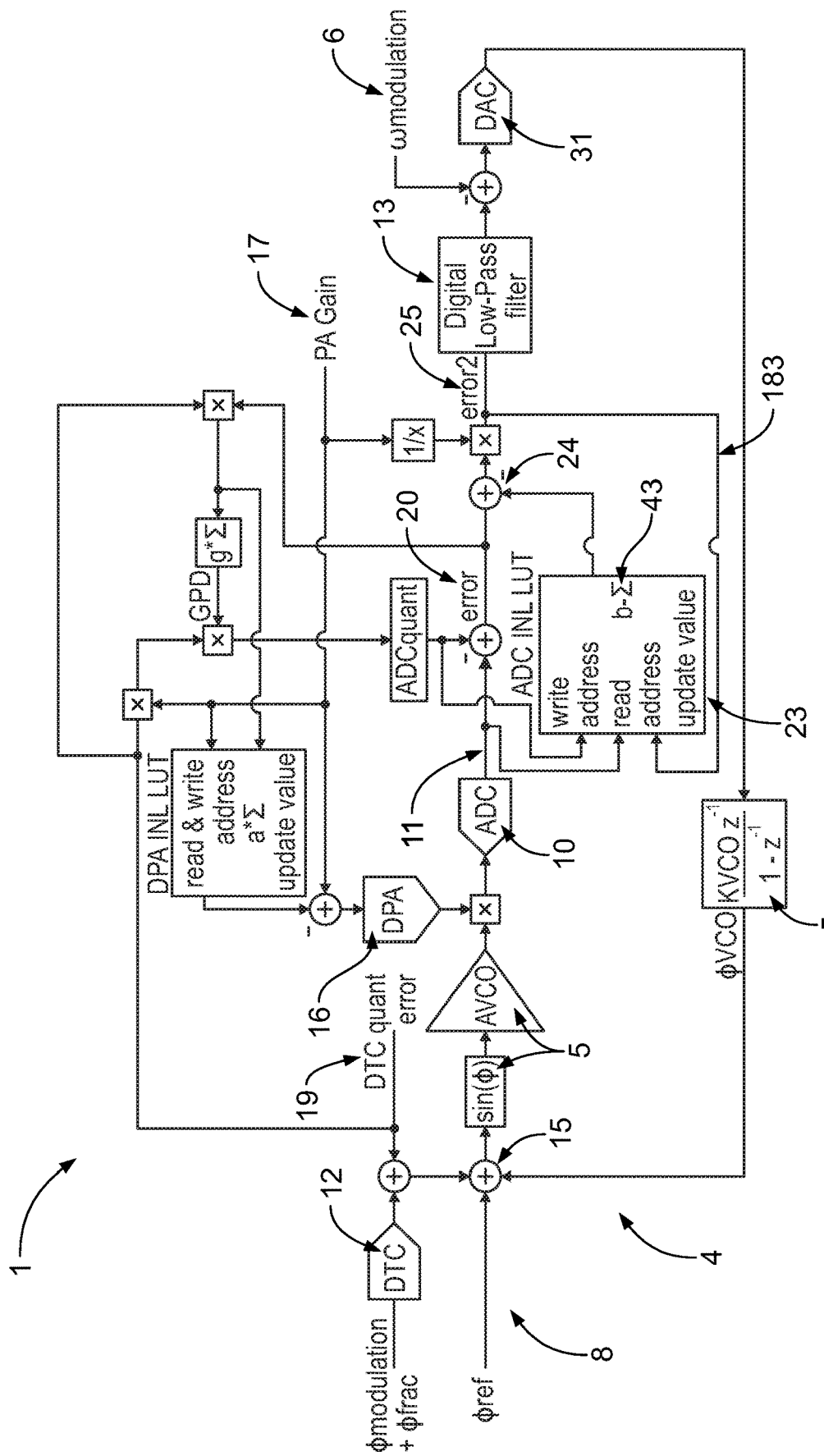
FIG. 6 shows a further embodiment of the polar transmitter of FIG. 5, according to an example embodiment.
Figure 7:
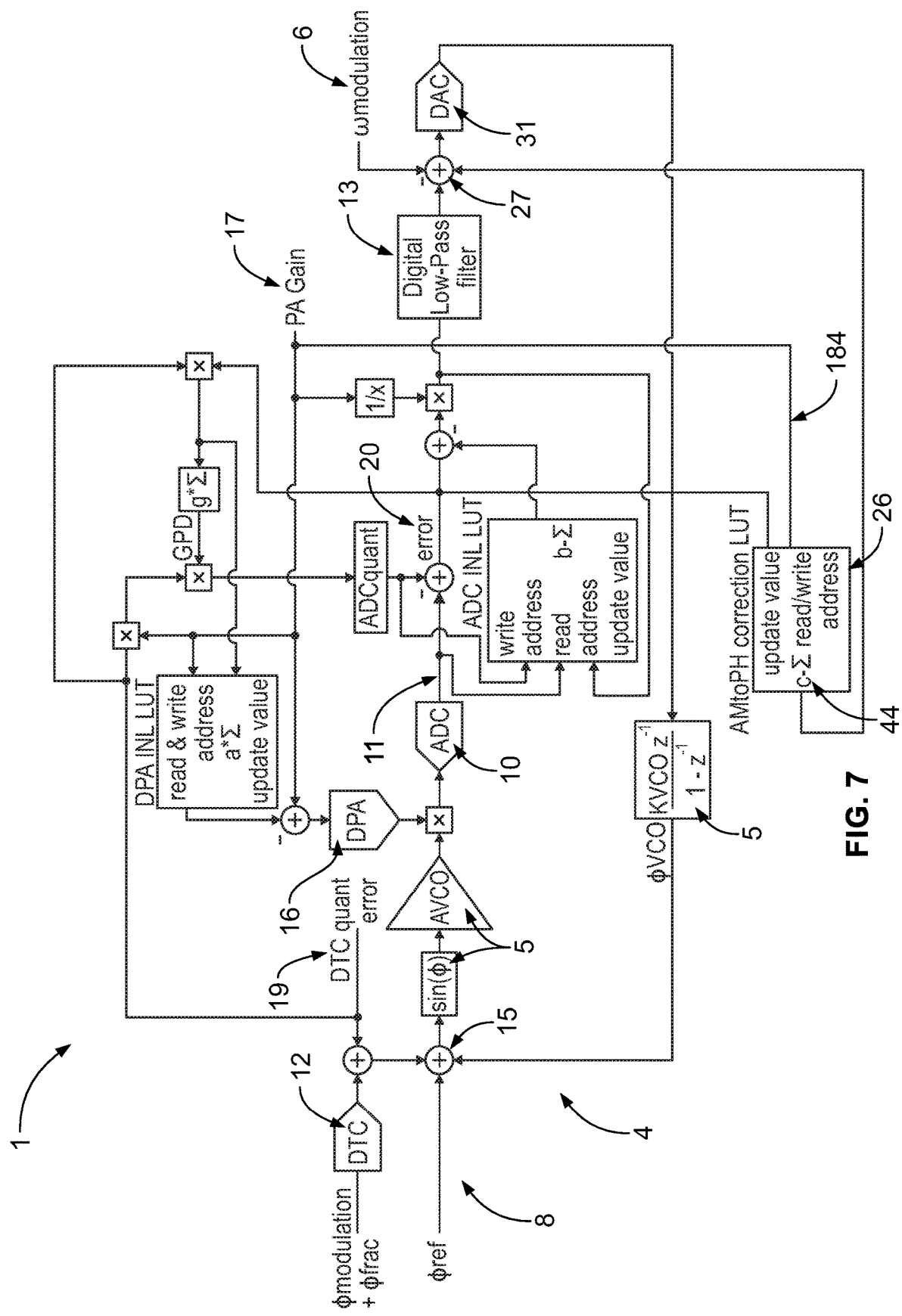
FIG. 7 shows a further embodiment of the polar transmitter of FIG. 6, according to an example embodiment.

The proposed DSSTx 1 architecture is capable of on-line AM-to-PM distortion calibration (see parts added in FIG. 7 with respect to FIG. 6). The calibration is based on observation of the error signal 20, which is correlated with the DPA gain 17 in case of pronounced AM-to-PM distortion. Similarly to the calibration techniques of the present disclosure described above, this effect is exploited in order to estimate the AM-to-PM transfer function, and to cancel the distortion effect by DAC input code 6 re-modulation. In other words, if the parasitic phase shift introduced by the DPA 16 is known, then the VCO 5 and DAC 31 can be pre-distorted to compensate for it.

The AM-to-PM distortion LUT 26 is populated with coefficients which represent the AM-to-PM distortion function. If the compensation is ideal, the error signal 20 is independent of the DPA Gain 17, i.e. the error signal 20 is a zero-mean stream per particular DPA Gain code 17. This is not true in case of an imperfect cancellation. Therefore, the instantaneous error signal value 20 (optionally scaled by a factor c 44) has to be added to the appropriate address in the AM-to-PM distortion LUT 26 (address defined by DPA Gain 17) to update the LUT cancellation coefficients. The LUT coefficients propagate towards values which accurately represent the AM-to-PM transfer function and then saturate, since this results in accurate distortion cancellation. Cancellation is realized by subtracting the LUT coefficient 27 from the $\omega_{modulation}$ signal 6, before the application to the DAC 31. It is important to note that the error signal 20 is observed in phase domain (at the output of the phase detector 8), while the correction is carried out in the frequency domain (at the DAC 31 input). For that, it is necessary to send a derivative of the LUT correction value 27 (not represented in the figure for higher clarity) to the modulation DAC 31. Furthermore, it is important to take care of any cycle delays during two point modulation (for example, VCO 5 acts as an integrator—which means that the correction applied by the DAC 31 appears as accumulated phase and not instantaneously).

In an example embodiment, the error signal 20 may be scaled with a factor c 44, before its addition to the appropriate address, to control the algorithm convergence speed. The calibration algorithm runs in the background, together with the calibration loops 181-183 described earlier while the DSSTx 1 runs normally.

Suppression of the PM-to-AM Distortion

An additional effect which degrades the overall transmitting performance is the PM-to-AM distortion. In the context of the DSSTx 1 for example, the following can happen: changing the VCO operating frequency can result in a parasitic VCO amplitude shift.

Figure 8:
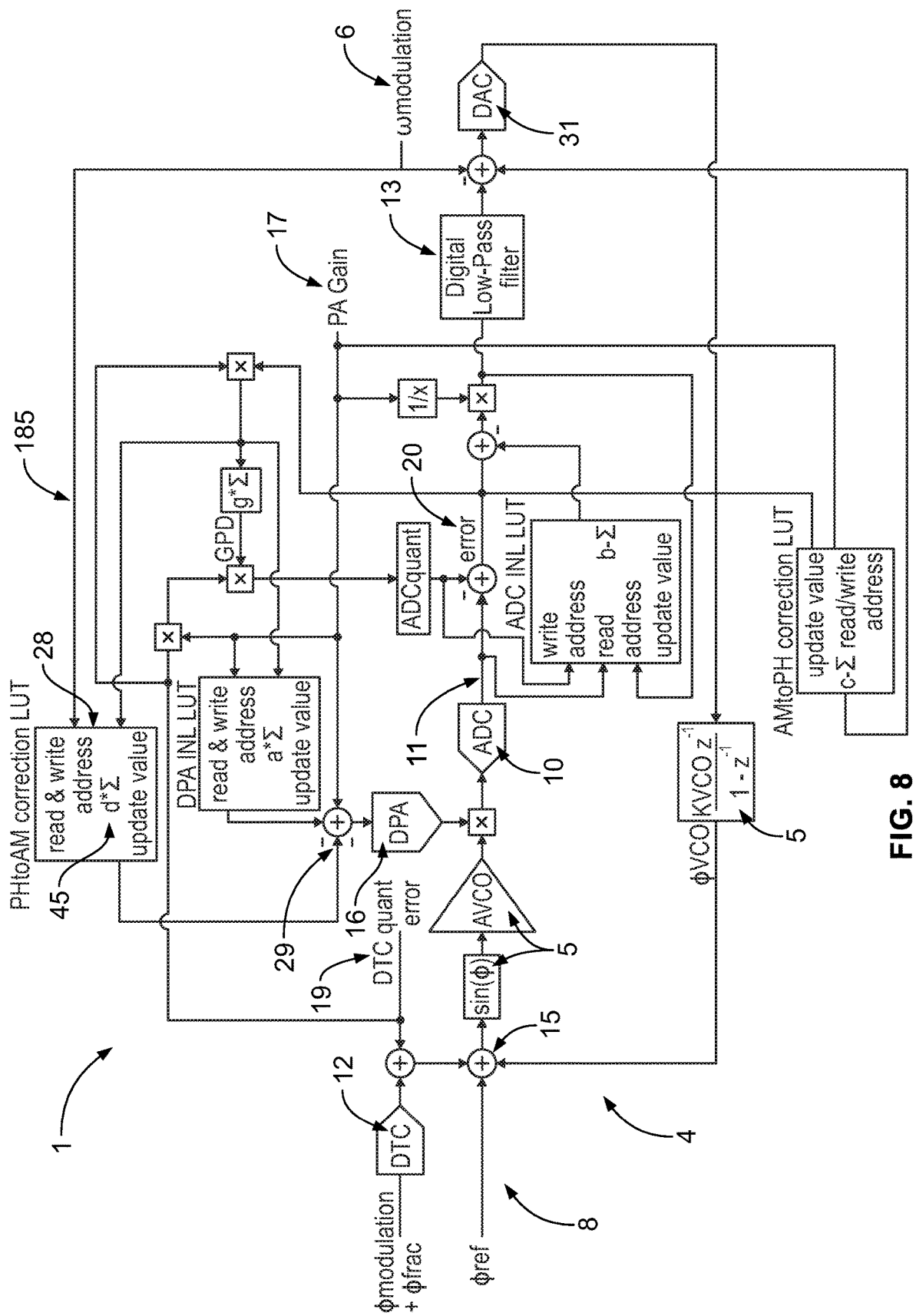
FIG. 8 shows a further embodiment of the polar transmitter of FIG. 7, according to an example embodiment.

Since the DSSTx 1 is capable of sensing the phase error detector gain, i.e. the amplitude of the output signal, it is possible to correct for parasitic effects such as this one (see parts added in FIG. 8 with respect to FIG. 7). The idea is to correlate the error signal 20 and the DTC quantization error 19 product with the frequency modulation signal 6. If there is no correlation between the two, there is no distortion as well, i.e. the phase detector gain is kept constant and independent of frequency modulating signal 6. If this is not true, and the correlation exists, a PM-to-AM distortion LUT 28 can be used to estimate the AM-to-PM distortion transfer function, and cancel it by redefining the DPA input code 17 (as depicted in FIG. 8).

In every cycle, the product of the error signal 20 and the DTC quantization error 19 is added to the value at the appropriate LUT address (frequency modulation data 6 is used for addressing). This event repeats itself in every cycle, adjusting the LUT coefficients until the error signal 20 and DTC quantization error 19 product becomes a zero mean signal w.r.t. particular frequency modulation code 6, i.e. until the DPA input code 17 creates just the expected amplitude change, without phase distortion.

In an example embodiment, the product signal value may be scaled with a factor d 45, before its addition to the appropriate LUT address, to control the algorithm convergence speed. The calibration algorithm runs in the background, together with the calibration loops 181-184 described earlier while the DSSTx 1 runs normally.

Calibration Results

Figure 9:
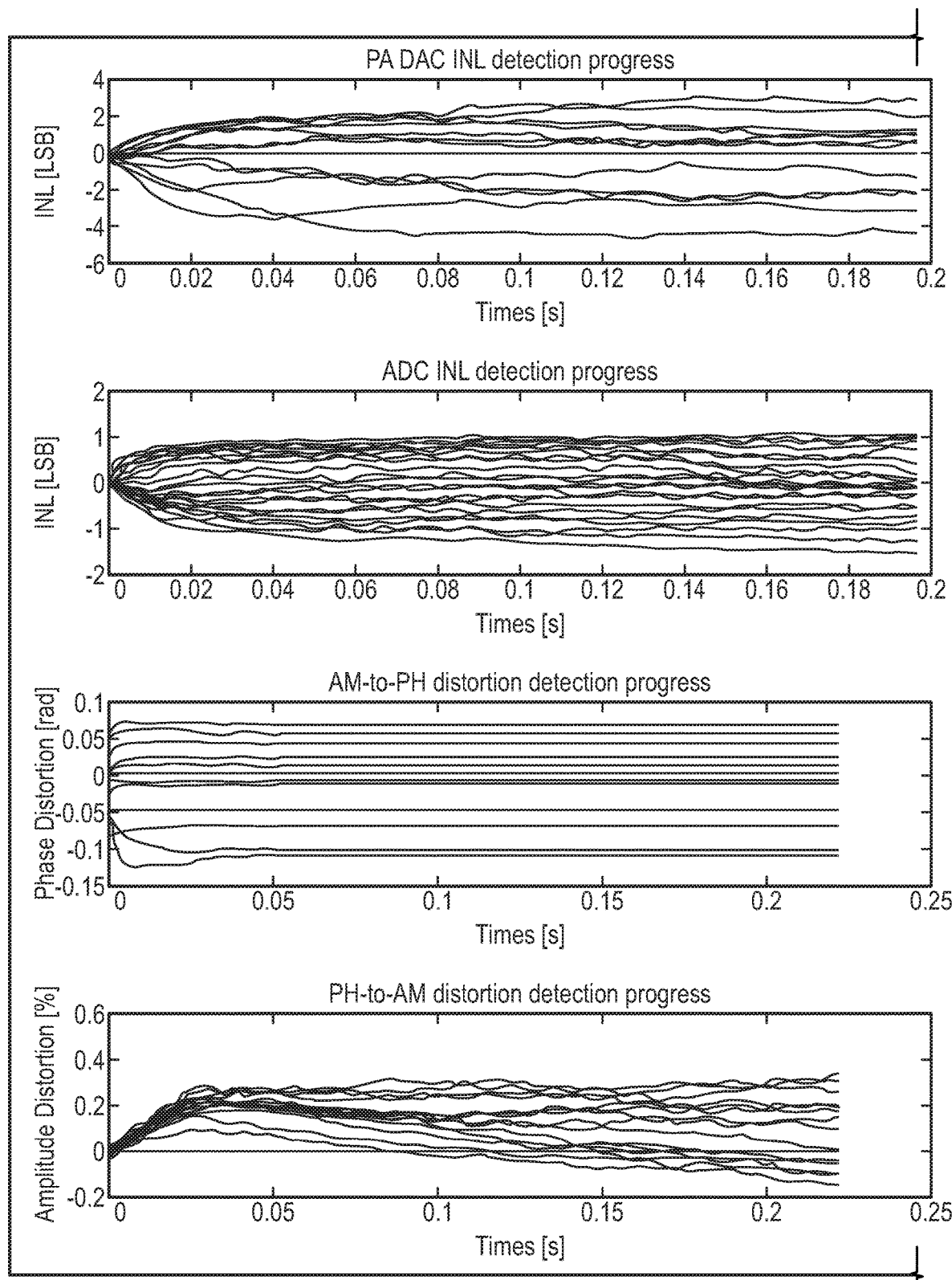
FIG. 9 and FIG. 9 (CONT'D) show test results of the polar transmitter of FIG. 8, according to an example embodiment.
Figure 9:
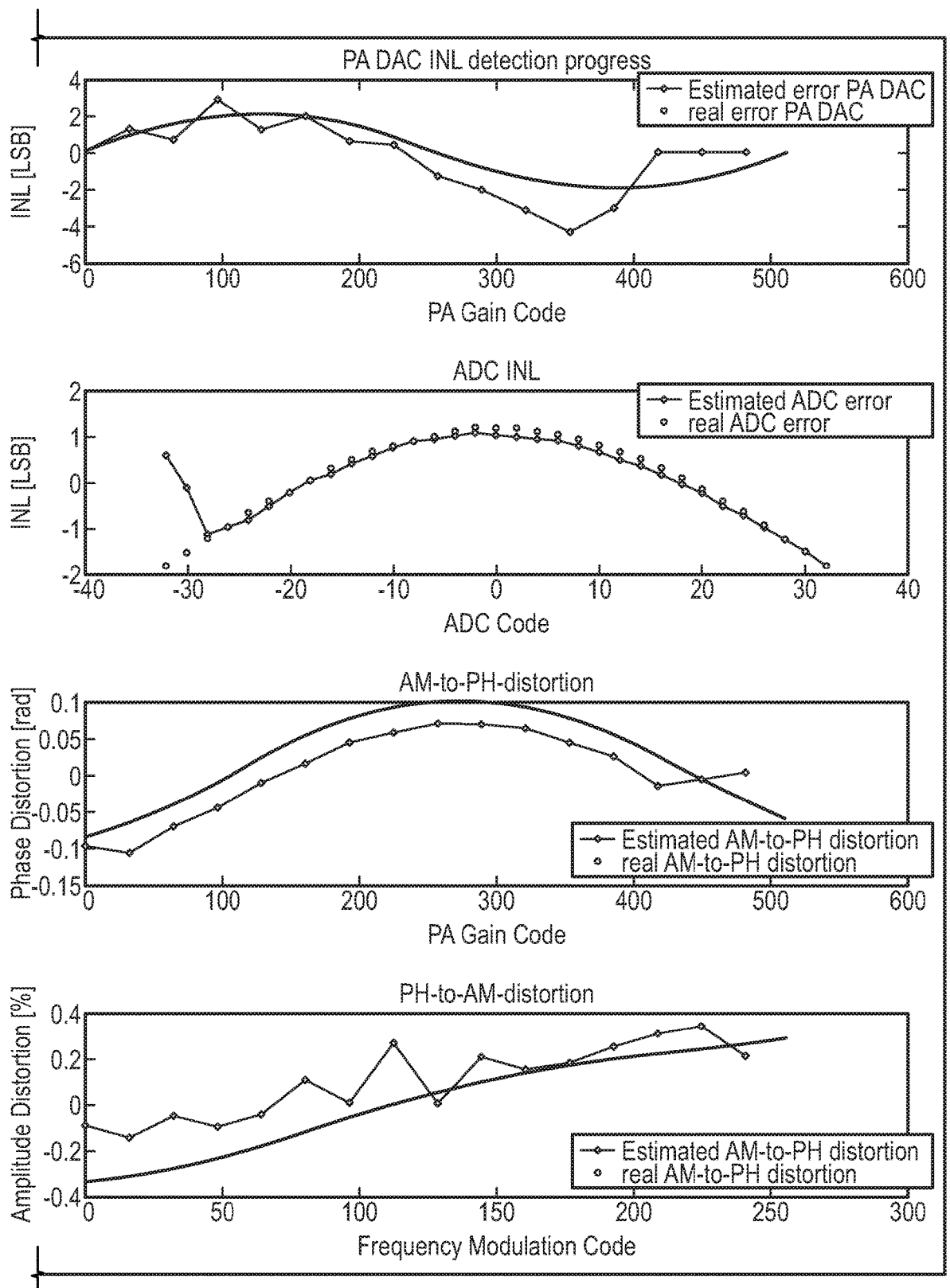

Test results of the calibration of the polar transmitter 1 of FIG. 8 are shown in FIG. 9. During this test the calibration runs in the background, while the transmitter operates normally.

FIG. 9 shows background calibration loops 181-185 settling within approximately 50 ms. The left column represents correction coefficients detection progress, while the right column shows the final correction estimates (-*-) and ideal correction estimates (+). From top to bottom, the progress of the DPA nonlinearity correction, ADC nonlinearity correction, AM-to-PM distortion correction, and PM-to-AM distortion correction are shown respectively.

As the calibration loops 181-185 operate independently of one another, all or some of them can be enabled to operate simultaneously. After a calibration reaches convergence, the respective calibration continues to run in the background tracking possible Process-Voltage-Temperature (PVT) variations. The estimated calibration coefficients may be stored in a memory before switching the transmitter off to speed-up the convergence next time when the transmitter 1 is turned on.

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. A polar transmitter provided for transmitting a phase/frequency modulated and amplitude modulated transmit signal, the polar transmitter comprising:
   a phase locked loop (PLL) configured to generate a phase/frequency modulated precursor of the transmit signal, wherein the PLL comprises:
      a controllable oscillator configured to generate the precursor and to frequency modulate the precursor by means of a frequency modulation signal; and
      a phase error detection unit configured to detect a phase error and an amplitude of a feedback signal that is fed back from an output of the PLL to the phase error detection unit, wherein the feedback signal is the transmit signal or is derived therefrom; and
   a digital amplitude modulator (DAM) configured to amplitude modulate the precursor so as to result in the transmit signal,
   wherein the DAM is arranged within the PLL for amplitude modulation of the precursor before being output by the PLL,
   wherein the PLL is a sub-sampling PLL,
   wherein the phase error detection unit is further configured to: (i) sub-sample, at a reference rate, the feedback signal and (ii) generate a phase error code proportional to a sub-sampled feedback signal with an analog-to-digital convertor (ADC),
   wherein the phase error detection unit comprises a digital-to-time converter (DTC) configured to delay a sub-sampling of the feedback signal, thereby enabling at least one of phase modulation of the precursor or fractional residue compensation.

2. The polar transmitter according to claim 1, wherein the controllable oscillator is a voltage-controlled oscillator, and wherein the precursor is a high frequency output sinewave.

3. The polar transmitter according to claim 1, further comprising a low-pass-filter configured to low-pass filter the precursor.

4. The polar transmitter according to claim 1,
   wherein the DAM uses an amplitude modulation signal to amplitude modulate the precursor, and
   wherein the generated phase error code is used to adjust a phase of the precursor generated by the controllable oscillator.

5. The polar transmitter according to claim 4, further comprising a calibration loop configured to calibrate the transmit signal for predetermined phase shifts,
   wherein the calibration loop is configured to calculate a phase error detection gain defined by a controllable oscillator output amplitude, a DAM gain, and an ADC gain, and
   wherein the phase error detection gain is iteratively calculated from a correlation between a predetermined phase shift and an error signal derived from the phase error code by subtracting the predetermined phase shift scaled by the calculated phase error detection gain.

6. The polar transmitter according to claim 1,
   wherein the phase error code is used for adjusting a phase of the precursor generated by the controllable oscillator,
   wherein the polar transmitter comprises a calibration loop configured to calibrate the transmit signal for predetermined phase shifts,
   wherein the calibration loop is configured to calculate a phase error detection gain defined by a controllable oscillator output amplitude, a DAM gain, and an ADC gain, and
   wherein the phase error detection gain is iteratively calculated from a correlation between a predetermined phase shift and an error signal derived from the phase error code by subtracting the predetermined phase shift scaled by the calculated phase error detection gain.

7. The polar transmitter according to claim 6, wherein the predetermined phase shift is one of a known quantization error of a component of the polar transmitter and a phase shift induced by a phase modulating component of the polar transmitter so as to calibrate the transmit signal.

8. The polar transmitter according to claim 6,
   wherein the calibration loop is configured to calibrate the transmit signal for DAM nonlinearity,
   wherein the amplitude modulation signal is corrected with a DAM nonlinearity correction value from DAM nonlinearity correction values stored in a DAM nonlinearity look-up-table (LUT),
   wherein the DAM nonlinearity correction value is derived from the amplitude modulation signal and a product of the predetermined phase shift and the error signal,
   wherein the DAM nonlinearity LUT is iteratively updated by means of the product of the predetermined phase shift and the error signal, and
   wherein the amplitude modulation signal is used for continuous addressing of the DAM nonlinearity LUT.

9. The polar transmitter according to claim 6,
   wherein the calibration loop is further configured to calibrate the transmit signal for ADC nonlinearity,
   wherein the error signal is corrected with an ADC nonlinearity correction value from ADC nonlinearity correction values stored in an ADC nonlinearity look-up-table (LUT) and derived from the phase error code and the corrected error signal,
   wherein the ADC nonlinearity LUT is iteratively updated by means of the corrected error signal, and
   wherein the phase error code is used for continuous addressing of the ADC nonlinearity LUT.

10. The polar transmitter according to claim 6,
wherein the calibration loop is further configured to calibrate the transmit signal for amplitude modulation to phase modulation distortion (AM-to-PM distortion),
wherein the frequency modulation signal is corrected by a frequency modulation correction value from frequency modulation correction values stored in an AM-to-PM distortion look-up-table (LUT) and derived from the amplitude modulation signal and the error signal,
wherein the AM-to-PM distortion LUT is iteratively updated by means of the error signal, and
wherein the amplitude modulation signal is used for continuous addressing of the AM-to-PM distortion LUT.

11. The polar transmitter according to claim 6,
wherein the calibration loop is further configured to calibrate the transmit signal for phase modulation to amplitude modulation distortion (PM-to-AM distortion),
wherein the amplitude modulation signal is corrected by an amplitude modulation correction value from amplitude modulation correction values stored in a PM-to-AM distortion look-up-table (LUT) and derived from the frequency modulation signal and a product of the predetermined phase shift and the error signal,
wherein the PM-to-AM distortion LUT is iteratively updated by means of the product of the predetermined phase shift and the error signal, and
wherein the frequency modulation signal is used for continuous addressing of the PM-to-AM distortion LUT.

12. The polar transmitter according to claim 1, wherein the DAM comprises a digital power amplifier (DPA).

13. The polar transmitter according to claim 12, wherein the DPA is placed at the output of the PLL.

14. A method for generating a phase/frequency modulated and amplitude modulated transmit signal by a polar transmitter, the method comprising the steps of:
generating, by a controllable oscillator of a phase locked loop (PLL) of the polar transmitter, a phase/frequency modulated precursor of the transmit signal using a frequency modulation signal;
detecting, by a phase error detection unit of the PLL, a phase error of a feedback signal which is fed back from an output of the PLL to the phase error detection unit, the feedback signal being the transmit signal or a signal derived therefrom;
amplitude modulating the precursor, by a digital amplitude modulator (DAM) within the PLL of the polar transmitter, so as to result in the transmit signal;
detecting, by the phase error detection unit of the PLL, an amplitude of the feedback signal, wherein the phase error detection unit is configured to generate a phase error code proportional to the phase error and the amplitude of the feedback signal; and
calibrating the transmit signal for predetermined phase shifts, wherein calibrating the transmit signal for predetermined phase shifts comprises:
(i) calculating an error signal by subtracting from the phase error code a predetermined phase shift scaled by a first estimate of a phase error detection gain defined by a controllable oscillator output amplitude, a DAM gain, and an analog-to-digital convertor (ADC) gain; and
(ii) calculating a further estimate of the phase error detection gain from a correlation between the predetermined phase shift and the error signal.

15. The method according to claim 14, wherein calibrating the transmit signal for predetermined phase shifts further comprises:
(iii) iteratively repeating steps (i) and (ii) using the further estimate of the phase error detection gain until saturation.

16. The method according to claim 15, wherein the predetermined phase shift is one of: (i) a known quantization error of a component of the polar transmitter, and (ii) a phase shift induced by a phase modulating component of the polar transmitter so as to calibrate the transmit signal.

17. The method according to claim 15, further comprising calibrating the transmit signal for DAM nonlinearity, wherein calibrating the transmit signal for DAM nonlinearity comprises the steps of:
(iv) retrieving a DAM nonlinearity correction value by addressing a DAM nonlinearity look-up-table (LUT) with an amplitude modulation signal, wherein the DAM nonlinearity LUT storing DAM nonlinearity correction values are derived from the amplitude modulation signal and are a product of the predetermined phase shift and the error signal;
(v) correcting the amplitude modulation signal by subtracting the retrieved DAM nonlinearity correction value;
(vi) updating the DAM nonlinearity LUT using the product of the predetermined phase shift and the error signal; and
(vii) iteratively repeating steps (iv) to (v) until saturation of the DAM nonlinearity LUT.

18. The method according to claim 15, further comprising calibrating the transmit signal for ADC nonlinearity, wherein calibrating the transmit signal for ADC nonlinearity comprises the steps of:
(iv) retrieving an ADC nonlinearity correction value by addressing an ADC nonlinearity look-up-table (LUT) with the phase error code, wherein the ADC nonlinearity LUT storing ADC nonlinearity correction values are derived from the phase error code and a corrected error signal;
(v) correcting the error signal by subtracting the retrieved ADC nonlinearity correction value;
(vi) updating the ADC nonlinearity LUT using the corrected error signal; and
(vii) iteratively repeating steps (iii) to (v) until saturation of the ADC nonlinearity LUT.

19. The method according to claim 15, further comprising calibrating the transmit signal for amplitude modulation to phase modulation distortion (AM-to-PM distortion), wherein calibrating the transmit signal for AM-to-PM distortion comprises the steps of:
(iv) retrieving a frequency modulation correction value by addressing an AM-to-PM distortion look-up-table (LUT) with an amplitude modulation signal, the AM-to-PM distortion LUT storing frequency modulation correction values derived from the amplitude modulation signal and the error signal;
(v) correcting a frequency modulation signal by subtracting the retrieved frequency modulation correction value;
(vi) updating the AM-to-PM distortion LUT using the error signal; and
(viii) iteratively repeating steps (iii) to (v) until saturation of the AM-to-PM distortion LUT.

20. The method according to claim 15, further comprising calibrating the transmit signal for phase modulation to amplitude modulation distortion (PM-to-AM distortion), wherein calibrating the transmit signal for PM-to-AM distortion comprises the steps of:
- (iv) retrieving an amplitude modulation correction value by addressing a PM-to-AM distortion look-up-table (LUT) with a frequency modulation signal, wherein the PM-to-AM distortion LUT stores amplitude modulation correction values derived from the frequency modulation signal and a product of the predetermined phase shift and the error signal;
- (v) correcting an amplitude modulation signal by subtracting the retrieved amplitude modulation correction value;
- (vi) updating the PM-to-AM distortion LUT using the product of the predetermined phase shift and the error signal; and
- (vii) iteratively repeating steps (iii) to (v) until saturation of the PM-to-AM distortion LUT.

\* \* \* \* \*